United States Patent
Kitakado

(10) Patent No.: US 9,812,581 B2
(45) Date of Patent: Nov. 7, 2017

(54) SEMICONDUCTOR DEVICE AND METHOD FOR MANUFACTURING SAME

(71) Applicant: Sharp Kabushiki Kaisha, Osaka-shi, Osaka (JP)

(72) Inventor: Hidehito Kitakado, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 65 days.

(21) Appl. No.: 14/772,791

(22) PCT Filed: Feb. 25, 2014

(86) PCT No.: PCT/JP2014/054476
§ 371 (c)(1),
(2) Date: Sep. 4, 2015

(87) PCT Pub. No.: WO2014/136612
PCT Pub. Date: Sep. 12, 2014

(65) Prior Publication Data
US 2016/0013325 A1    Jan. 14, 2016

(30) Foreign Application Priority Data

Mar. 7, 2013   (JP) ................ 2013-045059

(51) Int. Cl.
*H01L 29/786*   (2006.01)
*G02F 1/1362*   (2006.01)
(Continued)

(52) U.S. Cl.
CPC ...... *H01L 29/78633* (2013.01); *G02F 1/1362* (2013.01); *H01L 29/45* (2013.01);
(Continued)

(58) Field of Classification Search
CPC ............ H01L 29/45; H01L 29/78633; H01L 29/66969; H01L 29/78618; H01L 29/7869; H01L 29/78693
(Continued)

(56) References Cited

U.S. PATENT DOCUMENTS

2001/0040648 A1   11/2001   Ono et al.
2010/0025678 A1    2/2010   Yamazaki et al.
(Continued)

FOREIGN PATENT DOCUMENTS

JP    2001-324725 A    11/2001
JP    2010-056539 A    3/2010
(Continued)

OTHER PUBLICATIONS

Official Communication issued in International Patent Application No. PCT/JP2014/054476, mailed on Apr. 28, 2014.

*Primary Examiner* — Bo Fan
(74) *Attorney, Agent, or Firm* — Keating & Bennett, LLP

(57) ABSTRACT

A semiconductor device (1001) includes an oxide semiconductor layer (7) and a conductor layer (13a, 13b, 13c, 13s) supported on a substrate (1). The oxide semiconductor layer (7) contains a first metallic element. The conductor layer (13a, 13b, 13c, 13s) has a multilayer structure including a first metal oxide layer (m1) containing the first metallic element, a second metal oxide layer (m2) on the first metal oxide layer, the second metal oxide layer (m2) containing an oxide of a second metallic element, and a metal layer (M) on the second metal oxide layer, the metal layer (M) containing the second metallic element. The first metal oxide layer (m1) and the oxide semiconductor layer (7) are made of the same oxide film. When viewed from the normal direction of the substrate 1, the first metal oxide layer (m1) and the oxide semiconductor layer (7) do not overlap.

19 Claims, 9 Drawing Sheets

(51) Int. Cl.
*H01L 29/45* (2006.01)
*H01L 29/66* (2006.01)

(52) U.S. Cl.
CPC .... *H01L 29/66969* (2013.01); *H01L 29/7869* (2013.01); *H01L 29/78618* (2013.01); *H01L 29/78693* (2013.01)

(58) Field of Classification Search
USPC .............................. 257/43, 57, 296; 438/104
See application file for complete search history.

(56) References Cited

U.S. PATENT DOCUMENTS

| | | | |
|---|---|---|---|
| 2010/0134710 A1 | 6/2010 | Ishitani et al. | |
| 2011/0140205 A1 | 6/2011 | Sakata et al. | |
| 2011/0227060 A1* | 9/2011 | Miyanaga | H01L 29/7869 257/43 |
| 2012/0052624 A1* | 3/2012 | Yamazaki | H01L 29/4908 438/104 |
| 2012/0112257 A1* | 5/2012 | Kato | H01L 27/0688 257/296 |
| 2012/0126227 A1* | 5/2012 | Maeda | H01L 27/1225 257/43 |
| 2012/0138922 A1 | 6/2012 | Yamazaki et al. | |
| 2013/0020570 A1* | 1/2013 | Yamazaki | G11C 11/404 257/43 |
| 2013/0023086 A1 | 1/2013 | Chikama et al. | |
| 2013/0037807 A1* | 2/2013 | Fukaya | H01L 27/1225 257/57 |
| 2013/0271690 A1 | 10/2013 | Matsukizono | |
| 2013/0285054 A1 | 10/2013 | Moriguchi et al. | |
| 2014/0035478 A1* | 2/2014 | Kitakado | H01L 29/7869 315/210 |

FOREIGN PATENT DOCUMENTS

| | | |
|---|---|---|
| JP | 2010-156960 A | 7/2010 |
| JP | 2011-142311 A | 7/2011 |
| JP | 2012-134475 A | 7/2012 |
| JP | 2012-248865 A | 12/2012 |
| WO | 2012/077682 A1 | 6/2012 |
| WO | 2012/090794 A1 | 7/2012 |
| WO | 2012/117936 A1 | 9/2012 |

* cited by examiner (a)

(b)

(c)

SEMICONDUCTOR DEVICE AND METHOD FOR MANUFACTURING SAME

TECHNICAL FIELD

The present invention relates to a semiconductor device in which an oxide semiconductor is used and a production method thereof.

BACKGROUND ART

Active matrix substrates that are used for liquid crystal display devices or the like include a switching element for each pixel, e.g., a thin film transistor (hereinafter "TFT"). As such switching elements, TFTs whose active layers are an amorphous silicon film (hereinafter "amorphous silicon TFTs") and TFTs whose active layers are a polycrystalline silicon film (hereinafter "polycrystalline silicon TFTs") have been widely used.

In the recent years, it has been proposed to use an oxide semiconductor as the material of the active layers of TFTs, instead of an amorphous silicon or a polycrystalline silicon. These TFTs are called "oxide semiconductor TFTs". An oxide semiconductor provides a higher mobility than does an amorphous silicon. Therefore, oxide semiconductor TFTs can operate more rapidly than amorphous silicon TFTs. Moreover, an oxide semiconductor film is formed through a simple process as compared to a polycrystalline silicon film, and therefore is applicable to devices which require a large geometric area.

Patent Documents 1 and 2 disclose TFTs of a bottom gate structure in which an oxide semiconductor is used. In the TFT disclosed in Patent Document 1, metal oxide layers are formed between an oxide semiconductor layer and source/drain electrodes for enhanced contact between them. Patent Document 2 proposes allowing an oxide semiconductor layer to react with source/drain electrodes, thus forming reaction layers therebetween.

CITATION LIST

Patent Literature

[Patent Document 1] Japanese Laid-Open Patent Publication No. 2010-156960
[Patent Document 2] International Publication No. 2012/090794

SUMMARY OF INVENTION

Technical Problem

In the conventional oxide semiconductor TFTs disclosed in Patent Documents 1 and 2, a metal oxide layer or a reaction layer is at the interface between an oxide semiconductor layer and a source/drain electrode. In other words, the oxide semiconductor layer underlies the metal oxide layer or the reaction layer.

The inventors have conducted a study to find that oxide semiconductor TFTs of the above constructions may not be able to sufficiently restrain light entering through the substrate from being reflected by the source/drain electrodes. Part of the light reflected from the source/drain electrodes or the like will undergo repetitive reflections at the inside of the semiconductor device, and enter the channel portion of the oxide semiconductor layer, thus possibly affecting the long-term reliability of the thin film transistor. In the case where the substrate having the TFT formed thereon is provided at the display surface side of the display device, there is a possibility that external light may be reflected by the source/drain electrodes or the like, thus causing a deteriorated displaying contrast.

Furthermore, the inventors have found that forming a capacitor element on the substrate having the oxide semiconductor TFT disclosed in Patent Documents 1 and 2 may result in a problem in that changing electrical resistance of the oxide semiconductor layer that composes the capacitor element may cause changing capacitance. This problem will be described in detail later.

The present invention has been made in view of the above circumstances, and it is an objective of an embodiment of the present invention to provide a novel electrode structure for a semiconductor device in which an oxide semiconductor is used, such that reflection of light incident on the semiconductor device is reduced and problems associated with changing electrical resistance of the oxide semiconductor layer are suppressed.

Solution to Problem

A semiconductor device according to an embodiment of the present invention is a semiconductor device comprising a substrate, and an oxide semiconductor layer and a conductor layer supported on the substrate, the oxide semiconductor layer containing a first metallic element, the conductor layer having a multilayer structure including a first metal oxide layer containing the first metallic element, a second metal oxide layer on the first metal oxide layer, the second metal oxide layer containing an oxide of a second metallic element, and a metal layer on the second metal oxide layer, the metal layer containing the second metallic element, wherein, the first metal oxide layer and the oxide semiconductor layer are made of a same oxide film; and when viewed from a normal direction of the substrate, the first metal oxide layer and the oxide semiconductor layer do not overlap each other.

In one embodiment, the same oxide film is an oxide semiconductor film containing the first metallic element; the first metal oxide layer is a layer having been made electrically conductive as a result of the oxide semiconductor film reacting with the metal layer; and the second metal oxide layer is a layer resulting from a portion of the metal layer reacting with the oxide semiconductor film.

In one embodiment, an atomic ratio of oxygen relative to the totality of metallic elements contained in the first metal oxide layer is 95% or less of an atomic ratio of oxygen relative to the totality of metallic elements that is calculated from a stoichiometric composition of the oxide semiconductor film.

In one embodiment, the first metal oxide layer has an electrical resistivity of 0.01 Ω·cm or less.

One embodiment further comprises a thin film transistor, wherein the conductor layer includes a source electrode of the thin film transistor, and a source line connected to the source electrode.

In one embodiment, the oxide semiconductor layer functions as an active layer of the thin film transistor.

One embodiment further comprises a capacitor element, wherein, the capacitor element includes a lower electrode and an upper electrode disposed so as to overlap the lower electrode via a dielectric film; and the conductor layer includes the upper electrode.

One embodiment further comprises a thin film transistor, wherein the conductor layer includes a gate electrode of the thin film transistor and a gate line connected to the gate electrode.

One embodiment further comprises a thin film transistor, wherein, the thin film transistor includes an etchstop formed on an upper face of the oxide semiconductor layer; a portion of a source electrode of the thin film transistor is on the etchstop; and a portion of the source electrode that is not on the etchstop has the multilayer structure, and the portion of the source electrode that is on the etchstop is composed only of the metal layer.

In one embodiment, the first metal oxide layer has a thickness which is substantially equal to a thickness of the oxide semiconductor layer.

In one embodiment, the conductor layer includes a light shielding layer to shade the oxide semiconductor layer.

In one embodiment, a total thickness of the second metal oxide layer and the metal layer is twice or more of a thickness of the first metal oxide layer.

In one embodiment, the first metallic element is indium, and the second metallic element is titanium.

In one embodiment, the oxide semiconductor layer and the first metal oxide layer contain an In—Ga—Zn—O type oxide.

In one embodiment, the first and second metal oxide layers are layers formed by subjecting the oxide semiconductor film and the metal layer formed thereon to a heat treatment at a temperature of not less than 250° C. and not more than 400° C.

A method of producing a semiconductor device according to an embodiment of the present invention comprises: (a) a step of forming an oxide semiconductor film on a substrate, the oxide semiconductor film containing a first metallic element; (b) a step of forming a metal layer on a portion of a surface of the oxide semiconductor film, the metal layer containing a second metallic element; and (c) a step of conducting a heat treatment for allowing the metal layer and the oxide semiconductor film to react to form a first metal oxide layer containing the first metallic element by making a portion of the oxide semiconductor film that is in contact with the metal layer electrically conductive across a thickness direction, and to form a second metal oxide layer containing an oxide of the second metallic element between the first metal oxide layer and the metal layer, the step producing a conductor layer having a multilayer structure including the first metal oxide layer, the second metal oxide layer, and the metal layer, and leaving a portion of the oxide semiconductor film that is not in contact with the metal layer as a semiconductor region to become an oxide semiconductor layer.

In one embodiment, the semiconductor device includes a thin film transistor, the method further comprising, before step (a), a step (d) of providing a substrate including a gate electrode of the thin film transistor and a gate dielectric layer formed so as to cover the gate electrode, wherein, step (a) forms the oxide semiconductor film on the gate dielectric layer; and the conductor layer includes a source electrode of the thin film transistor and a source line, and the oxide semiconductor layer includes an active layer of the thin film transistor.

In one embodiment, the semiconductor device includes a capacitor element; step (d) comprises step (d1) of forming an electrically conductive film on the substrate and patterning the electrically conductive film to form the gate electrode and a lower electrode of the capacitor element, and step (d2) of forming the gate dielectric layer so as to cover the gate electrode and the lower electrode; and the conductor layer includes an upper electrode of the capacitor element, the upper electrode overlapping the lower electrode via the gate dielectric layer.

One embodiment further comprises, between step (a) and step (b), a step of forming an etchstop covering a portion of the oxide semiconductor film to become an active layer.

In one embodiment, the metal layer formed in step (b) has a thickness which is twice or more of a thickness of the oxide semiconductor film.

In one embodiment, step (b) comprises: forming a metal film on the oxide semiconductor film; forming a resist layer on the metal film by using a gradation mask, the resist layer having a first portion and a second portion thinner than the first portion; patterning the metal film by using the resist layer as a mask; removing the second portion by reducing the thickness of the resist layer; and a step of patterning the metal film by using the resist layer with the reduced thickness as a mask to expose the portion of the surface of the oxide semiconductor film.

In one embodiment, the temperature of the heat treatment in step (c) is not less than 250° C. and not more than 400° C.

In one embodiment, the oxide semiconductor film contains an In—Ga—Zn—O type oxide.

Advantageous Effects of Invention

According to an embodiment of the present invention, in a semiconductor device in which an oxide semiconductor is used, it is possible to reduce light reflection by a metal layer composing electrodes, lines, and the like, and suppress problems associated with changing electrical resistance of the oxide semiconductor layer.

DESCRIPTION OF EMBODIMENTS

Figure 1:
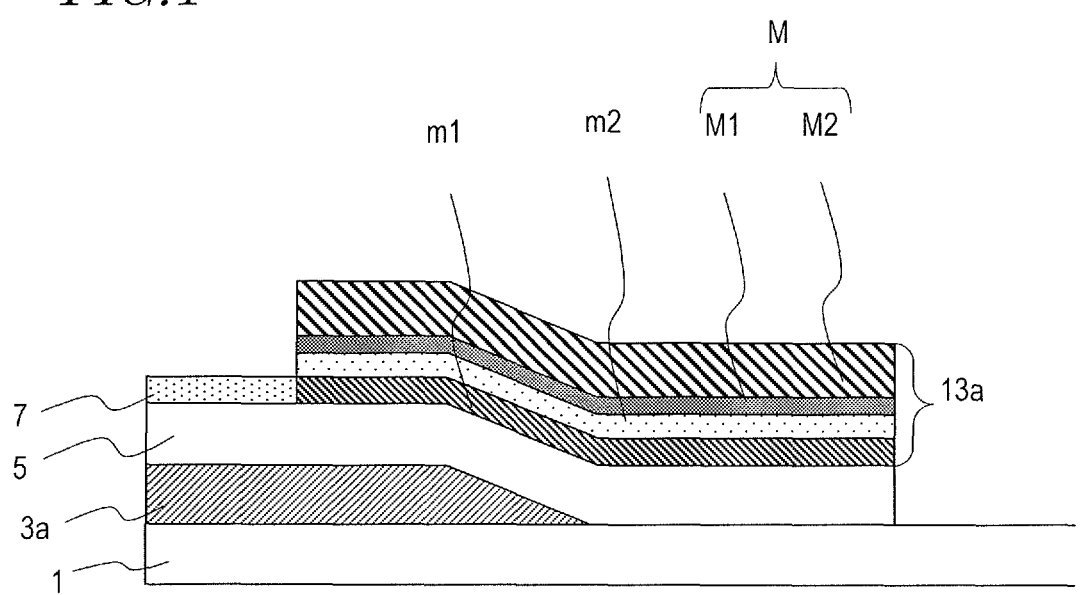
FIG. 1 A schematic partial cross-sectional view illustrating an exemplary electrode structure according to an embodiment of the present invention.

As described earlier, with the constructions disclosed in Patent Documents 1 and 2, it may be difficult to sufficiently suppress reflection of visible light caused by electrodes/lines, including the source/drain electrodes and the like. As used herein, "electrodes/lines" refer to electrodes, lines, or any layer containing electrodes and lines (including also the case where electrodes and lines are integrally formed).

For example, in the construction of Patent Document 1, a metal oxide layer and an oxide semiconductor layer are provided on the substrate side of the electrodes/lines; however, the oxide semiconductor layer, in particular, is transparent with respect to visible light and may not exhibit a sufficient antireflection effect. Moreover, the oxide semiconductor layer is provided in island shapes and the metal oxide layer is disposed only for parts of the electrodes/lines; thus, no metal oxide layer or oxide semiconductor layer is provided on the substrate side of most part of the electrodes/lines, including the source/drain electrodes. Therefore, reflection occurring in these portions (e.g., reflection by the source lines) cannot be suppressed. On the other hand, in the construction of Patent Document 2, a reaction layer and an oxide semiconductor layer are provided over substantially the entire lower face of the electrodes/lines, so that reflection by the electrodes/lines will be more effectively suppressed than in the construction of Patent Document 1. However, depending on the structure or purpose of the semiconductor device, a more effective suppression of reflection may be desired.

On the other hand, the following problems may occur when a capacitor element is to be formed in the semiconductor device disclosed in Patent Document 2.

In a semiconductor device having an oxide semiconductor TFT, a capacitance may occasionally be formed by a lower electrode which is formed in the same layer as the gate electrode, an upper electrode which is formed in the same layer as the source/drain electrodes, and a dielectric film, e.g., a gate dielectric layer, that is located between these electrodes. When such a capacitor element is formed on the semiconductor device disclosed in Patent Document 2, in which a reaction layer and an oxide semiconductor layer are provided on the substrate side of the upper electrode, not only the gate dielectric layer but also the oxide semiconductor layer will exist between the upper electrode and the lower electrode of the capacitor element, these acting as dielectric films. Moreover, as a process of producing a semiconductor device with fewer masks, it has conventionally been proposed to concurrently pattern a source line layer and an oxide semiconductor film. When a capacitor element is to be formed in a semiconductor device which is produced through this process, too, not only the gate dielectric layer but also the oxide semiconductor layer will exist between the electrodes of the capacitor element.

In such a capacitor element, the electrical resistance of the oxide semiconductor layer may change depending on the polarity of the voltage which is applied between the electrodes of the capacitor element, whereby its capacitance may change. For example, in the case where an In—Ga—Zn—O type oxide (In:Ga:Zn:O=1:1:1:4) is used as the oxide semiconductor, the oxide semiconductor will become electrically conductive when a positive bias with respect to the upper electrode is applied to the lower electrode of the capacitor element; and it will become electrically insulative when a negative bias is applied. Therefore, the oxide semiconductor layer functions as a partial electrode when a positive bias is applied to the electrodes of the capacitor element, whereas the oxide semiconductor layer functions as a dielectric film when a negative bias is applied. Thus, depending on the voltage that is applied to the electrodes of the capacitor element, the thickness of the dielectric film composing the capacitor element will vary, thus resulting in a fluctuating capacitance.

The inventors have studied electrode structures that may solve the above problems. As a result, they have found a novel electrode structure in which the oxide semiconductor layer is made electrically conductive across the thickness direction to function as a partial electrode, thus arriving at the present invention.

The novel electrode structure can be formed in the following manner, for example. First, after an oxide semiconductor film is formed on a substrate, a metal layer is formed on a portion of the oxide semiconductor film. Next, the metal contained in the metal layer is allowed to react with the oxide semiconductor. As a result, the portion of the oxide semiconductor film which is in contact with the metal layer is made electrically conductive across the thickness direction, thus forming a first metal oxide layer. At the same time, the neighborhood of the surface of the metal layer facing the oxide semiconductor film becomes oxidized, thus forming a second metal oxide layer. In this manner, electrodes/lines of a multilayer structure that includes the first and second metal oxide layers and the metal layer are obtained. This method makes it possible to form a construction in which no oxide semiconductor exists under the electrodes/lines, by a simple process and through self assembly.

Hereinafter, with reference to the drawings, an exemplary electrode structure according to an embodiment of the present invention will be described more specifically.

FIG. 1 is a partial cross-sectional view illustrating an exemplary semiconductor device including a source electrode having the above electrode structure.

The semiconductor device includes a gate electrode 3*a* formed on a substrate 1, an oxide semiconductor layer 7 disposed on the gate electrode 3*a* via a gate dielectric layer 5, and a source electrode 13*a* electrically connected to the oxide semiconductor layer 7. The source electrode 13a is structured so that a first metal oxide layer m1, a second metal oxide layer m2, and a metal layer M are stacked in this order on the gate dielectric layer 5. The first metal oxide layer m1 contains an oxide that contains the same metallic element (first metallic element) as that in the oxide semiconductor layer 7. The second metal oxide layer m2 contains an oxide of a metallic element (second metallic element) that is contained in the metal layer M. Moreover, when viewed from the normal direction of the substrate 1, the first metal oxide layer m1 and the oxide semiconductor layer 7 do not overlap each other. In the illustrated example, the metal layer M has a multilayer structure composed of a first metal layer M1 and a second metal layer M2. Alternatively, the metal layer M may be single-layered.

In the electrodes/lines having the above electrode structure, the first and second metal oxide layers m1 and m2 are on the substrate 1 side of the metal layer M. Moreover, no oxide semiconductor layer 7 exists on the substrate 1 side of the first metal oxide layer m1. With such construction, as will be described later, light reflection by the metal layer M can be more effectively suppressed by the first and second metal oxide layers m1 and m2.

Furthermore, when the above electrode structure is applied to the upper electrode of a capacitor element, no oxide semiconductor layer 7 exists between the upper electrode and the lower electrode of the capacitor element, so that changes in changes in capacitance due to voltage application to the electrodes of the capacitor element can be suppressed.

Upon further studies, the inventors have found that the aforementioned novel electrode structure, i.e., a multilayer structure including first and second metal oxide layers and a metal layer, is broadly applicable to various conductor layers including not only the electrodes/lines such as source electrodes, source lines, gate electrodes, gate lines, electrodes of capacitor elements, or CS capacitor lines, but also light shielding layers and the like. In the present specification, a conductor layer having the above multilayer structure will be referred to a "conductor layer having metal oxide layers" or simply a "conductor layer".

First Embodiment

Hereinafter, with reference to the drawings, a first embodiment of the semiconductor device according to the present invention will be described. The semiconductor device of the present embodiment includes a thin film transistor (oxide semiconductor TFT) which has an active layer made of an oxide semiconductor. Note that the semiconductor device of the present embodiment broadly encompasses semiconductor elements such as thin film transistors, active matrix substrates, various display devices, electronic devices, etc., so long as it has an oxide semiconductor layer and electrodes/lines having metal oxide layers.

Now, a TFT substrate which includes oxide semiconductor TFTs as switching elements will be described as an example. The TFT substrate according to the present embodiment is suitably used for liquid crystal display devices.

FIG. 2(a) is a plan view illustrating an exemplary semiconductor device 1001 of the present embodiment. FIG. 2(b) is a cross-sectional view of an oxide semiconductor TFT 10 shown in FIG. 2(a), and FIG. 2(c) is a cross-sectional view of a capacitor element 20 shown in FIG. 2(a).

The semiconductor device (TFT substrate) 1001 of the present embodiment has a displaying region 100 including a plurality of pixels 101 and a region other than the displaying region (non-display region) 200.

For each pixel 101, a source line 13s extending along the column direction of pixels, a gate line 3g extending along the row direction of pixels, an oxide semiconductor TFT 10, and a pixel electrode 19 are provided. In the present embodiment, the gate line 3g includes a gate electrode 3a. The oxide semiconductor TFT 10 is disposed near a point where the source line 13s and the gate line 3g intersect. In the illustrated example, a CS capacitor line 3c which is made of the same electrically conductive film as the gate line 3g is provided in the pixel 101. A capacitor element 20 is disposed over the CS capacitor line 3c.

In the non-display region (terminal deployment region) 200, a plurality of terminal portions 201 for allowing the gate lines 3g and the source lines 13s to be connected to external wiring are provided. Each source line 13s extends toward the edge of the displaying region 100, so as to be connected to a source connecting portion 13sg. At a source-gate connecting portion 30, the source connecting portion 13sg is electrically connected to a gate connecting portion 3sg which is made of the same film as the gate lines. The gate connecting portion 3sg extends to the terminal deployment region 200, so as to be connected to external wiring at the terminal portion (source terminal) 201. Although not shown, each gate lines 3g extends to the terminal deployment region 200, so as to be connected to external wiring at a terminal portion (gate terminal).

In this example, the source lines 13s, the source connecting portions 13sg, the source electrodes 13a and drain electrodes 13b of the oxide semiconductor TFTs 10, and upper electrodes 13c of the capacitor elements 20 are formed in the same layer (referred to as a "source line layer"). The source line layer is a conductor layer having metal oxide layers.

Next, with reference to FIG. 2(b) and FIG. 2(c), cross-sectional structures of the oxide semiconductor TFTs 10 and the capacitor elements 20 will be described more specifically.

Each oxide semiconductor TFT 10 includes a gate electrode 3a formed on the substrate 1, a gate dielectric layer 5 covering the gate electrode 3a, and an oxide semiconductor layer (e.g., an In—Ga—Zn—O type oxide semiconductor layer) 7 disposed on the gate dielectric layer 5. The oxide semiconductor layer 7 is disposed so as to overlap the gate electrode 3a when viewed from the normal direction of the substrate 1. On the gate dielectric layer 5 are provided a source electrode 13a, a drain electrode 13b, and a source line 13s (FIG. 2(a)), these being in contact with the upper face of the gate dielectric layer 5.

The source electrode 13a, the drain electrode 13b, and the source line 13s (a conductor layer having metal oxide layers) have a multilayer structure that includes: a first metal oxide layer m1 containing a first metallic element (e.g., indium); a second metal oxide layer m2 disposed on the surface of the first metal oxide layer m1; and a metal layer M being disposed on the second metal oxide layer m2 and containing a second metallic element (e.g., titanium). The first metal oxide layer m1 is a conductor layer containing an oxide that contains the first metallic element (e.g., In—Ga—Zn—O type oxide). The lower face of the first metal oxide layer m1 is not in contact with the oxide semiconductor layer 7. Therefore, when viewed from the normal direction of the substrate 1, the first metal oxide layer m1 and the oxide semiconductor layer 7 do not overlap. The second metal oxide layer m2 is a conductor layer containing an oxide of the second metallic element (e.g., titanium oxide ($TiO_2$)).

In the present embodiment, the oxide semiconductor layer 7 and the first metal oxide layer m1 are made of the same oxide film. The same oxide film may be an oxide semiconductor film containing the first metallic element. A portion of the oxide semiconductor film may be made electrically conductive across the thickness direction to form the first metal oxide layer m1, while the oxide semiconductor layer 7 may be constituted by the region of the oxide semiconductor film that remains as a semiconductor. The first metal oxide layer m1 may be a layer resulting from the oxide semiconductor film reacting with the metal layer M to become electrically conductive, while the second metal oxide layer m2 may be a layer resulting from a portion of the metal layer M (a lower portion of the metal layer M) reacting with the oxide semiconductor film. In this case, the side face of the first metal oxide layer m1 is aligned with the side faces of the second metal oxide layer m2 and the metal layer M. The side faces of the first metal oxide layer m1 and the second metal oxide layer m2 may in some cases be disposed closer toward the oxide semiconductor layer 7 than is the side face of the metal layer M.

In the present specification, a layer that includes both a semiconductor region(s) and a conductor region(s), obtained by making the oxide semiconductor film partially electrically conductive, is referred to as the "oxide layer 6". In this example, the oxide layer 6 includes an oxide semiconductor layer (semiconductor region) 7 to become an active layer of each TFT and a first metal oxide layer (conductor region) m1 constituting each source electrode 13a and each drain electrode 13b.

In the present embodiment, in each source electrode 13a and each drain electrode 13b, the side face of the first metal oxide layer m1 is in contact with the side face of the oxide semiconductor layer 7, whereby the source electrode 13a and the drain electrode 13b are each electrically connected to the oxide semiconductor layer 7. The source electrode 13a is connected to the source line 13s. The drain electrode 13b is connected to the pixel electrode 19.

On the other hand, as shown in FIG. 2(c), each capacitor element 20 is constituted by a CS capacitor line (a lower electrode of the capacitor element) 3c, an upper electrode 13c, and the gate dielectric layer 5 interposed therebetween. The CS capacitor line 3c is made of the same electrically conductive film as the gate line 3g. The upper electrode 13c is a conductor layer having metal oxide layers, which is made of the same electrically conductive film as the source and drain electrodes 13a and 13b and which has a similar electrode structure thereto, i.e., a multilayer structure including a metal layer M/a second metal oxide layer m2/and a first metal oxide layer m1. In this example, the drain electrode 13b extends over the CS capacitor line 3c to function as the upper electrode 13c. Between the CS capacitor line 3c and the upper electrode 13c, there is no oxide semiconductor layer 7 or other oxide semiconductor layer.

Although not shown, in each source-gate connecting portion 30, the gate connecting portion 3sg and the source connecting portion 13sg may be connected within an opening which is made in the gate dielectric layer 5. The gate connecting portion 3sg may be made of the same electrically conductive film as the gate line 3g. The source connecting portion 13sg may be made of the same electrically conductive film as the source and drain electrodes 13a and 13b, and have a similar multilayer structure thereto.

In accordance with the semiconductor device 1001 of the present embodiment, the first and second metal oxide layers m1 and m2 being disposed on the substrate 1 side of the metal layer M suppress reflection of visible light by the metal layer M. For example, the second metal oxide layer m2 has a refractive index (e.g., about 3.0) which is higher than the refractive index (e.g., about 1.5) of the dielectric films such as the gate dielectric layer 5, and thus can function as an antireflection film for the metal layer M. Moreover, the first metal oxide layer m1 (refractive index: e.g. about 2.0) provides, in addition to the aforementioned antireflection effect based on refractive indices, a light-absorption based antireflection effect for the metal layer M. Particularly in the case where the first metal oxide layer m1 is formed by making the oxide semiconductor film electrically conductive, it changes into a composition where the oxygen ratio relative to the totality of metallic elements is much smaller than in the stoichiometric composition of the oxide semiconductor, whereby absorption of visible light occurs. As a result of this, the antireflection effect based on light absorption by the first metal oxide layer m1 becomes more enhanced than in the case where an oxide semiconductor film is provided on the substrate side of the metal layer M without being made electrically conductive. On the other hand, in the constructions disclosed in Patent Documents 1 and 2, a metal oxide layer or a reaction layer and an oxide semiconductor layer are formed on the substrate side of the source electrode (metal layer). While the oxide semiconductor layer may have an antireflection effect based on refractive indices, it is transparent with respect to visible light and thus its antireflection effect based on light absorption is smaller than that of the first metal oxide layer m1, for example. Therefore, according to the present embodiment, reflection by the metal layer M can be suppressed more efficiently than in conventional semiconductor devices.

Moreover, by adjusting the thickness and/or refractive index of the second metal oxide layer m2, it is possible to obtain an even higher antireflection effect. The thickness of the second metal oxide layer m2 is adjusted to not less than 10 nm and not more than 30 nm, for example. As described earlier, in the case where the first metal oxide layer m1 is formed from an oxide semiconductor film by allowing the oxide semiconductor film to reach with a metal film and the second metal oxide layer m2 is formed by oxidizing the metal film, the oxygen with which to oxidize the metal film is supplied from the oxide semiconductor film. The thickness of the oxide semiconductor film is not less than 30 nm and not more than 60 nm, for example (in the case where the oxide semiconductor film is also utilized as the TFT active layer). By making such an oxide semiconductor film electrically conductive entirely across the thickness direction, it becomes possible to supply oxygen to the metal film in an amount which is suitable for forming the second metal oxide layer m2 of the aforementioned thickness.

The semiconductor device 1001 of the present embodiment also provides the following effect.

For example, in the conventional semiconductor device disclosed in Patent Document 2, when an upper electrode of a capacitor element is formed in a source line layer and a lower electrode of the capacitor element in a gate line layer, some oxide semiconductor film exists between the upper electrode and the lower electrode. Since the oxide semiconductor film may function as a portion of the dielectric layer of the capacitor element or function as a partial electrode depending on the polarity of the voltage which is applied to the electrodes of the capacitor element, changes in the capacitance value will occur. Specifically, in the case where the oxide semiconductor is an N type semiconductor, the resultant capacitance will be the capacitance of the gate dielectric layer when a positive bias with respect to the upper electrode of the capacitor element is applied to the lower electrode of the capacitor element. When a negative bias is applied to the upper electrode, the resultant capacitance will be the capacitances of the gate dielectric layer and the oxide semiconductor layer. A similar phenomenon will also occur in the case where the oxide semiconductor is a P type semiconductor, although in opposite polarities. On the other hand, according to the present embodiment, no oxide semiconductor film exists between the lower electrode 3c and the upper electrode 13c of the capacitor element 20, so that the aforementioned problem of changing capacitance does not occur.

Although not shown, in the present embodiment, the oxide semiconductor TFT 10 is covered by an interlevel dielectric layer. The pixel electrodes 19 are disposed on the interlevel dielectric layer. Each pixel electrode 19 is in contact with the drain electrode 13b within a contact hole which is made in the interlevel dielectric layer.

The oxide semiconductor layer 7 in the present embodiment is, for example, an In—Ga—Zn—O type semiconductor layer (with a thickness of e.g. 45 nm). The oxide semiconductor layer 7 contains a semiconductor of an In—Ga—Zn—O type (hereinafter abbreviated as an "In—Ga—Zn—O type semiconductor"), for example. Herein, the In—Ga—Zn—O type semiconductor is a ternary oxide of In (indium), Ga (gallium), and Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. The In—Ga—Zn—O type semiconductor may be amorphous or crystalline. As a crystalline In—Ga—Zn—O type semiconductor, a crystalline In—Ga—Zn—O type semiconductor whose c axis is oriented generally perpendicular to the layer plane is preferable. The crystal structure of such an In—Ga—Zn—O type semiconductor is disclosed in Japanese Laid-Open Patent Publication No. 2012-134475, for example. The entire disclosure of Japanese Laid-Open Patent Publication No. 2012-134475 is incorporated herein by reference. A TFT having an In—Ga—Zn—O type semiconductor layer has a high mobility (more than 20 times that of an a-Si TFT) and a low leak current (less than 1/100 of that of an a-Si TFT), and is suitably used as a driving TFT or a pixel TFT.

The oxide semiconductor layer 7 may contain other oxide semiconductors instead of an In—Ga—Zn—O type semiconductor. It may contain, for example, a Zn—O type semiconductor (ZnO), an In—Zn—O type semiconductor (IZO), a Zn—Ti—O type semiconductor (ZTO), a Cd—Ge—O type semiconductor, a Cd—Pb—O type semiconductor, an In—Sn—Zn—O type semiconductor (e.g., $In_2O_3$—$SnO_2$—ZnO), an In—Ga—Sn—O type semiconductor, or the like.

The metal oxide contained in the first metal oxide layer m1 according to the present embodiment contains the same metallic element as that in the oxide semiconductor layer 7. The metal oxide is, for example, a metal oxide of an In—Ga—Zn—O type (an In—Ga—Zn—O type metal oxide). Instead, it may be a metal oxide of a Zn—O type (ZnO), an In—Zn—O type (IZO), a Zn—Ti—O type (ZTO), a Cd—Ge—O type, a Cd—Pb—O type, an In—Sn—Zn—O type (e.g., $In_2O_3$—$SnO_2$—ZnO), or an In—Ga—Sn—O type. In the present specification, In—Ga—Zn—O type semiconductors and In—Ga—Zn—O type metal oxides are collectively referred to as "In—Ga—Zn—O type oxides".

The first metal oxide layer m1 may be formed by making an oxide semiconductor film containing the first metallic element electrically conductive. Moreover, the first metal oxide layer m1 may be made of the same oxide film as the oxide semiconductor layer 7. For example, the first metal oxide layer m1 may be formed by making a portion of the oxide semiconductor film electrically conductive, and the oxide semiconductor layer 7 to become active layers of the oxide semiconductor TFTs 10 may be formed from the portions that remain as a semiconductor without becoming electrically conductive. Thus, forming the first metal oxide layer m1 and the oxide semiconductor layer 7 from the same oxide semiconductor film provides an advantage of being able to reduce the number of steps.

As will be described later, the first metal oxide layer m1 and the second metal oxide layer m2 may be layers that are formed through a reaction between the oxide semiconductor film and the metal layer M. The first metal oxide layer m1 and the second metal oxide layer m2 are different from each other. For example, the first metal oxide layer m1 may be a layer resulting from the oxide semiconductor film becoming reduced by losing some of its oxygen to the metal layer M through the aforementioned reaction. The second metal oxide layer m2 may be a layer resulting from a portion of the metal layer M becoming oxidized with the oxygen which is supplied from the oxide semiconductor film through the aforementioned reaction. Note that an oxidation-reduction reaction is considered to occur as the oxygen element diffusing between the metal layer M and the oxide semiconductor film.

In the case where the first metal oxide layer m1 is formed from an oxide semiconductor film, the atomic ratio R(m1) of oxygen relative to the totality of metallic elements contained in the first metal oxide layer m1 is preferably 95% or less of an atomic ratio R of oxygen relative to the totality of metallic elements that is calculated from the stoichiometric composition of the oxide semiconductor film. As a result of this, a first metal oxide layer m1 with lower resistance is obtained. On the other hand, the atomic ratio R(m1) of oxygen in the first metal oxide layer m1 is preferably e.g. 50% or more of the atomic ratio R of oxygen in the oxide semiconductor film. As a result of this, the first metal oxide layer m1 attains a sufficient light transmitting ability for the first and second metal oxide layers m1 and m2 to exhibit an antireflection effect as optical interference films. Furthermore, in the case where the second metal oxide layer m2 is formed by oxidizing a portion of the metal layer M with oxygen which is supplied from the oxide semiconductor film, it is possible to adjust the thickness and refractive index of the second metal oxide layer m2 to be within a range where the first and second metal oxide layers m1 and m2 can provide a sufficient antireflection effect by supplying e.g. not less than 5% and not more than 50% of the oxygen contained in the oxide semiconductor film to the metal layer M (i.e., 50%≤R(m1)≤95%).

The composition of each layer will be described more specifically, by taking for example a case where the oxide semiconductor film is a film containing an oxide semiconductor of an In—Ga—Zn—O type (hereinafter abbreviated as "In—Ga—Zn—O type semiconductor") and the metal layer M is a Ti layer. In the case where the In—Ga—Zn—O type semiconductor contained in the oxide semiconductor film has the stoichiometric composition $InGaZnO_y$, the atomic ratio R of oxygen relative to the totality of metallic elements in the oxide semiconductor film is y/3. In the case where the Ti in the metal layer M does not diffuse into the interior of the oxide semiconductor film (or if at all it diffuses, only in minute amounts) when making the oxide semiconductor film electrically conductive, the metal oxide contained in the first metal oxide layer m1 has the composition $InGaZnO_x$ (x<y). The atomic ratio R(m1) of oxygen relative to the totality of metallic elements in this case is x/3.

In the case where R(m1) is e.g. not less than 50% and not more than 95% of R, $0.5 \leq x/y \leq 0.95$. Therefore, if y=4, for example, x is not less than 2 and not more than 3.8. Note that the first metal oxide layer m1 may in some cases contain some Ti diffused from the metal layer M, in addition to In, Ga and Zn. In this case, the atomic ratio R(m1) of oxygen relative to the totality of metallic elements in the first metal oxide layer m1 is a ratio of the mole value of oxygen to the total mole values of In, Ga, Zn and Ti. On the other hand, in the case where the metal in the oxide semiconductor film such as In does not diffuse into the interior of the metal layer when making the oxide semiconductor film electrically conductive, the metal oxide contained in the second metal oxide layer m2 is $TiO_z$ ($0<z<2$), for example.

There is no particular limitation as to the method of making the first metal oxide layer m1 from the oxide semiconductor film. For example, in a state where the metal layer M has been formed on a portion of the surface of the oxide semiconductor film, the first metal oxide layer m1 can be formed by performing a heat treatment at a temperature of e.g. not less than 250° C. and not more than 400° C. to make the portion of the oxide semiconductor film that is located under the metal layer M electrically conductive. The heat treatment conditions are appropriately set so that the oxide semiconductor film is made electrically conductive across the thickness direction, without any particular limitation.

The electrical resistivity of the first metal oxide layer m1 is preferably 0.01 Ω·cm or less. In order for the first metal oxide layer m1 to function as an electrode of a capacitor element or the like, it is preferable that its carrier density is e.g. about $1 \times 10^{19}$ cm$^{-3}$ or more. When the carrier density is $1 \times 10^{19}$ cm$^{-3}$ or more, the electrical resistivity will be 0.01 Ω·cm or less. If the electrical resistivity is higher than 0.01 Ω·cm, the first metal oxide layer m1 will exhibit a semiconductor nature, so that high electrical conduction characteristics may not be ensured. Moreover, when in use as a capacitor element electrode, its capacitance may vary depending on the polarity of the voltage between the electrodes of the capacitor element.

Figure 2:
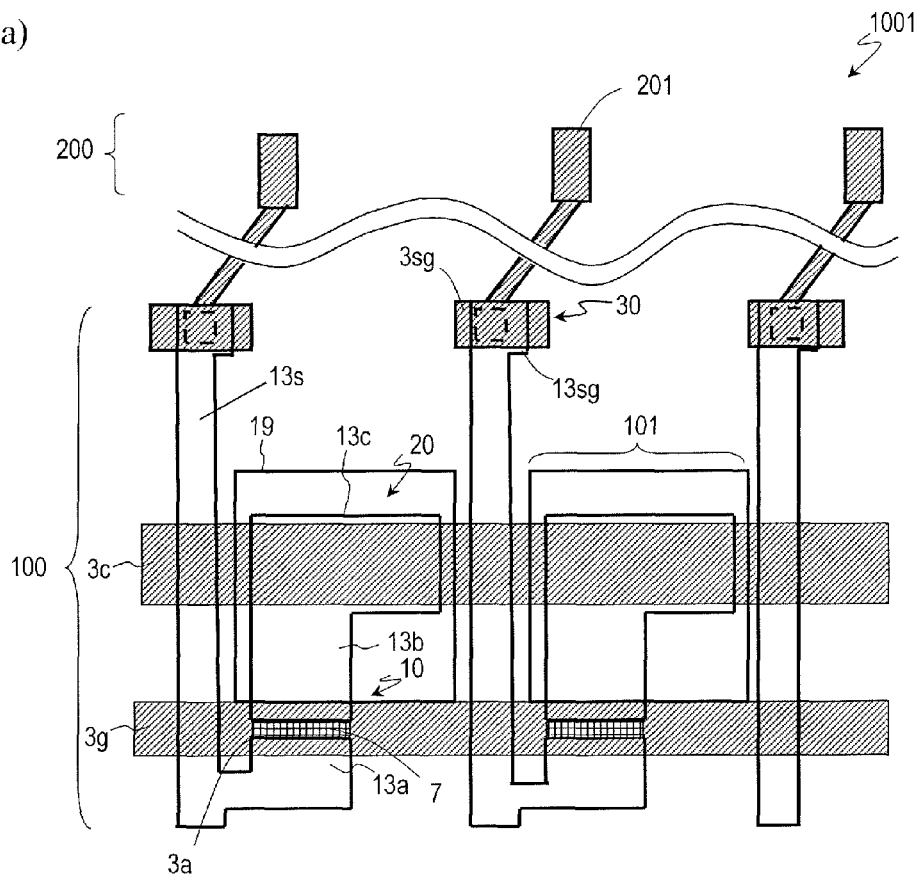
FIG. 2 (a) is a Plan View of a Semiconductor Device 1001 according to a first embodiment of the present invention; (b) is a cross-sectional view of an oxide semiconductor TFT 10 of the semiconductor device 1001; and (c) is a cross-sectional view of a capacitor element 20 of the semiconductor device 1001.
Figure 2:
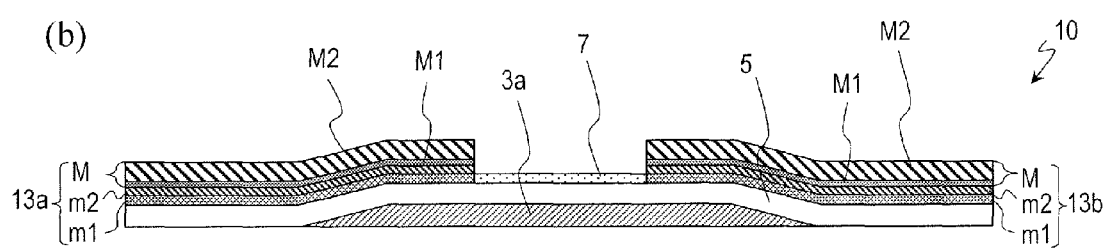
Figure 2:
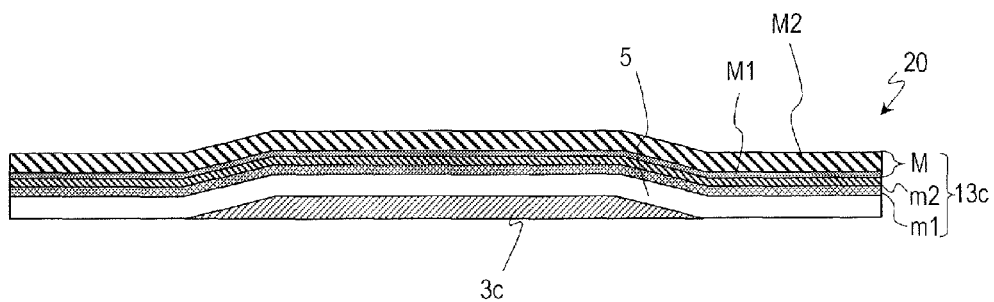

In the semiconductor device 1001 shown in FIG. 2, a source line layer including the source electrodes 13a, the drain electrodes 13b, and the source lines 13s has a multilayer structure including the first metal oxide layer m1, the second metal oxide layer m2, and the metal layer M. Alternatively, a gate line layer including the gate electrodes of the oxide semiconductor TFTs 10 and the gate lines may have the aforementioned multilayer structure. Alternatively, the source line layer and the gate line layer may each have the aforementioned multilayer structure. Moreover, a conductor layer having the aforementioned multilayer structure may be allowed to function as a light shielding layer.

In the present specification, any layer which is made of the same electrically conductive film as the source lines 13s is collectively referred to as a "source line layer". Therefore, the source line layer includes the source lines 13s, the source electrodes 13a, and the drain electrodes 13b. The source electrodes 13a may be formed integral with the source lines 13s. For example, each source line 13s may have a portion extending in a predetermined direction and a protrusion extending from that portion in a different direction from the predetermined direction, the protrusion functioning as a source electrode 13a. Similarly, any layer which is made of the same electrically conductive film as the gate lines 3g is collectively referred to as a "gate line layer". The gate electrodes 3a may be formed integral with the gate lines 3g. When each gate line 3g is viewed from the normal direction of the substrate 1, the gate line 3g may have a portion extending in a predetermined direction and a protrusion extending from that portion in a different direction from the predetermined direction, the protrusion functioning as a gate electrode 3a. Alternatively, when each gate line 3g is viewed from the normal direction of the substrate 1, the gate line 3g may have a plurality of linear portions extending in a predetermined direction with a constant width, such that a portion of each linear portion overlaps the channel region of a TFT to function as a gate electrode 3a.

<Production Method of the Semiconductor Device 1001>

Figure 3:
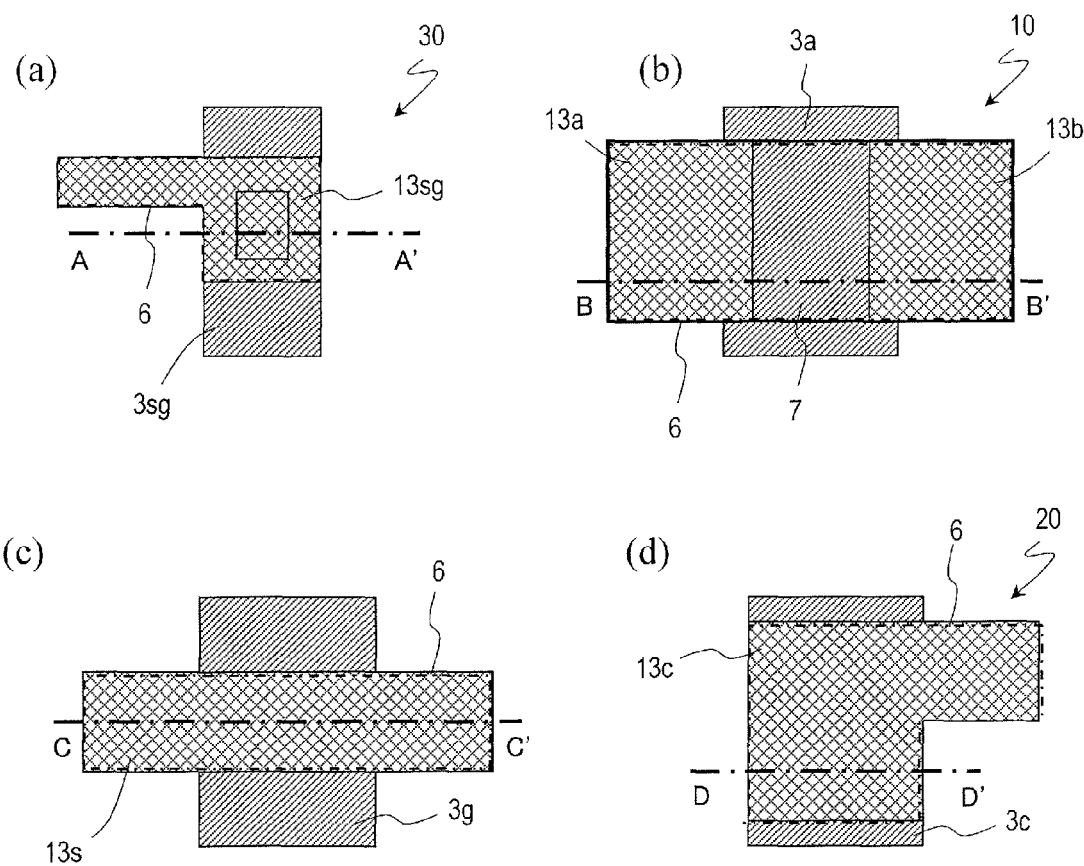
FIG. 3 (a) to (d) are plan views respectively illustrating an exemplary source-gate connecting portion 30, an exemplary oxide semiconductor TFT 10, an exemplary intersection at which a source line layer and a gate line layer intersect, and an exemplary capacitor element 20 in the semiconductor device 1001.

Next, with reference to FIG. 3 and FIG. 4, an exemplary production method for the semiconductor device 1001 of the present embodiment will be described.

FIGS. 3(a) to (d) are plan views respectively illustrating an exemplary source-gate connecting portion 30, an exemplary oxide semiconductor TFT 10, an exemplary intersection at which a source line layer and a gate line layer intersect, and an exemplary capacitor element 20 in the semiconductor device 1001. FIGS. 4(a1) to (a6) respectively are step-by-step cross-sectional views of a gate/source formation region forming a source-gate connecting portion 30, showing a cross section along line A-A' in FIG. 3(a). FIGS. 4(b1) to (b6) respectively are step-by-step cross-sectional views of a transistor formation region forming an oxide semiconductor TFT 10, showing a cross section along line B-B' in FIG. 3(b). FIGS. 4(c1) to (c6) respectively are step-by-step cross-sectional views of an intersection formation region at which a source line layer and a gate line layer intersect, showing a cross section along line C-C' in FIG. 3(c). FIGS. 4(d1) to (d6) respectively are step-by-step cross-sectional views of a capacitance formation region forming a capacitor element 20, showing a cross section along line D-D' in FIG. 3(d).

Figure 4:
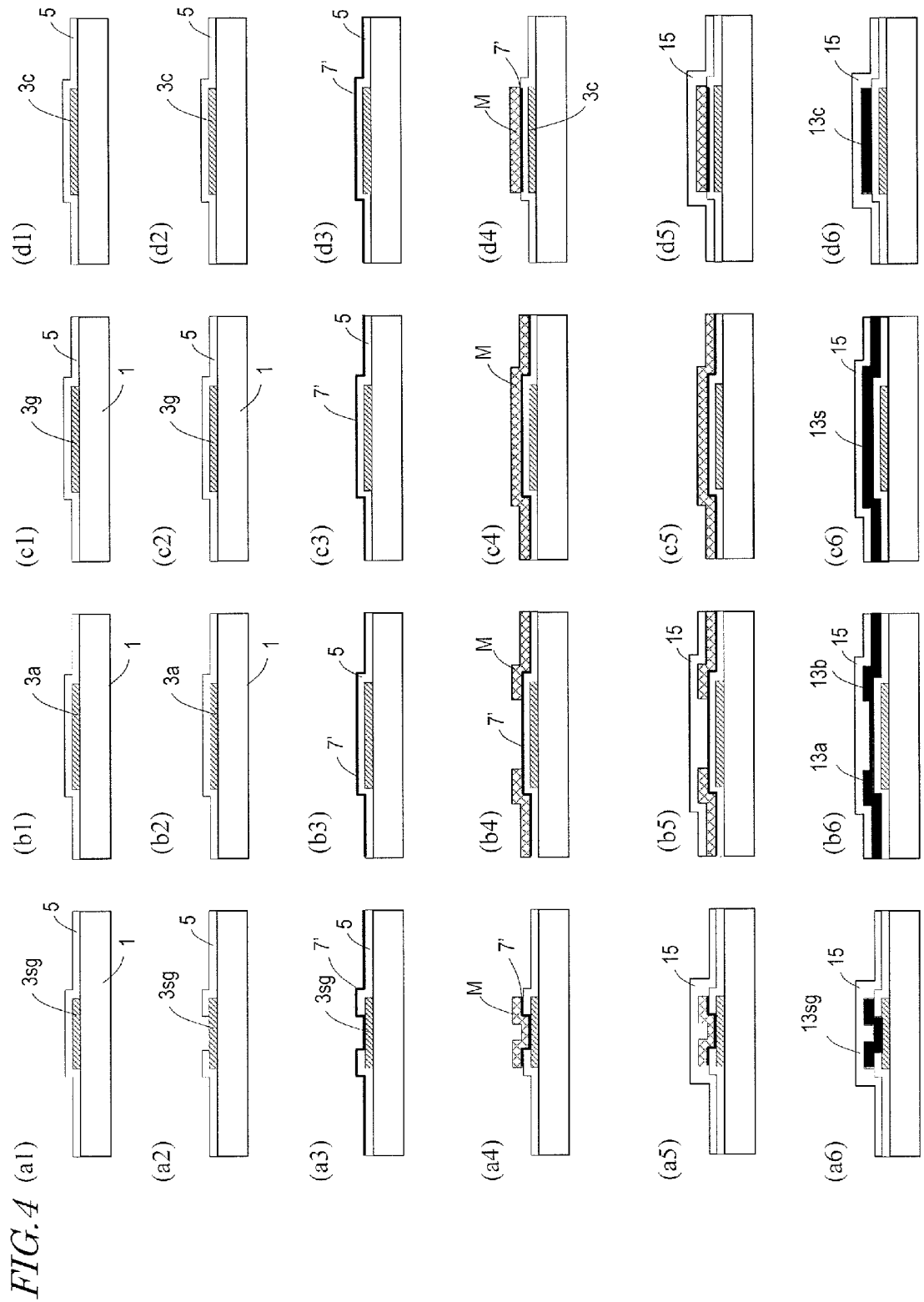
FIG. 4 A schematic diagram for describing a production method of the semiconductor device 1001, where (a1) to (a6) respectively are step-by-step cross-sectional views of a gate/source formation region forming a source-gate connecting portion 30; (b1) to (b6) respectively are step-by-step cross-sectional views of a transistor formation region forming an oxide semiconductor TFT 10; (c1) to (c6) respectively are step-by-step cross-sectional views of an intersection formation region at which a source line layer and a gate line layer intersect; and (d1) to (d6) respectively are step-by-step cross-sectional views of a capacitance formation region forming a capacitor element 20.

First, as shown in FIGS. 4(a1) to (d1), an electrode film for gates is formed on a substrate 1, and thereafter is patterned. Thus, a gate line layer including a gate connecting portion 3sg, a gate electrode 3a, a gate line 3g, and a CS capacitor line (lower electrode) 3c is formed. Next, a gate dielectric layer 5 is formed so as to cover the gate line layer.

There is no particular limitation as to the material of the electrode film for gates, and a film containing a metal such as aluminum (Al), tungsten (W), molybdenum (Mo), tantalum (Ta), chromium (Cr), titanium (Ti), or copper (Cu), or an alloy thereof, may be used as appropriate. A multilayer film in which a plurality of these films are stacked may also be used. Herein, a multilayer film with a Ti lower layer and a Cu upper layer (Ti/Cu) is used as the electrode film for gates, for example.

The gate dielectric layer 5 has a multilayer structure with a lower layer of silicon nitride ($SiN_x$) and an upper layer of silicon oxide ($SiO_2$), for example.

Then, as shown in FIGS. 4(a2) to (d2), in a source-gate connecting portion formation region, an opening for exposing the gate connecting portion 3sg is formed in the gate dielectric layer 5.

Next, as shown in FIGS. 4(a3) to (d3), an oxide semiconductor film 7' is formed on the gate dielectric layer by a sputtering technique, for example. Herein, the aforementioned In—Ga—Zn—O type semiconductor film is used as the oxide semiconductor film 7', for example. The oxide semiconductor film 7' has a thickness of not less than 30 nm and not more than 60 nm, for example. If the thickness of the oxide semiconductor film 7' is greater than 60 nm, it may be difficult to make the oxide semiconductor film sufficiently electrically conductive from its upper face to lower face through a heat treatment which will be described below. If the thickness of the oxide semiconductor film 7' is less than 30 nm, the channel resistance may increase, or the contact resistance between the oxide semiconductor layer to become the channel and the source/drain electrodes may increase.

Thereafter, as shown in FIGS. 4(a4) to (d4), an electrode film for sources is formed on the oxide semiconductor film 7' by a sputtering technique, for example, and the electrode film for sources and the oxide semiconductor film 7' are patterned. For example, as will be described later, after concurrently patterning the electrode film for sources and the oxide semiconductor film 7', the electrode film for sources existing over a portion (the portion to become a channel) of the oxide semiconductor film 7' (source-drain separation) may be removed. Alternatively, after patterning the oxide semiconductor film 7', an electrode film for sources may be formed and the electrode film for sources may be patterned. In this manner, a metal layer M composing a conductor layer having metal oxide layers (which herein is a source line layer) is obtained from the electrode film for sources. Moreover, the portions of the oxide semiconductor film 7' other than the portions to become a conductor layer having metal oxide and an oxide semiconductor layer (channel) are removed.

There is no particular limitation as to the electrode film for sources, and it may be a single-layer film or a multilayer film containing a similar material to that of the aforementioned electrode film for gates. However, it is preferable that the layer in the electrode film for sources that is in contact with the oxide semiconductor film 7' (i.e., the lowermost layer in the case where the electrode film for sources is a multilayer film) contains a metallic element (second metallic element) with which to reduce the oxide semiconductor film 7'. The second metallic element is Ti, Mo (molybdenum), or the like, for example. Therefore, the electrode film for sources may be a single layer containing the second metallic element or an alloy whose main component is the second metallic element. Herein, as the electrode film for sources, a multilayer film having a lower layer of a Ti film and an upper layer of a Cu film (Ti/Cu) is used, for example. The electrode film for sources has a thickness of e.g. 100 nm or more. The thickness of the electrode film for sources is preferably twice or more of the thickness of the oxide semiconductor film 7', for example. This better ensures that the oxide semiconductor film is made electrically conductive across its entire thickness through a reaction between the material of the electrode film for sources and the oxide semiconductor film 7'.

Then, as shown in FIGS. 4(a5) to (d5), a passivation film (e.g., an $SiO_2$ film) 15 is formed so as to cover the metal layer M.

Next, a heat treatment is performed while being covered by the passivation film 15, thereby allowing the metal layer M and the oxide semiconductor film 7' to react. Thus, as shown in FIG. 3(a) to (d) and FIGS. 4(a6) to (d6), a source line layer having a multilayer structure M/m2/m1 including a first metal oxide layer m1, a second metal oxide layer m2, and a metal layer M is obtained. The source line layer includes a source connecting portion 13sg (FIG. 4(a6)), a source electrode 13a and a drain electrode 13b (FIG. 4(b6)), a source line 13s (FIG. 4(c6)) and an upper electrode 13c (FIG. 4(d6)). The lower face of the source line layer is in contact with the gate dielectric layer 5.

Now, the reaction between the metal layer M and the oxide semiconductor film 7' will be described more specifically. Through this reaction, the second metallic element (e.g., Ti) contained in the metal layer M binds with the oxygen contained in the oxide semiconductor film 7', whereby a second metal oxide layer m2 (e.g., titanium oxide ($TiO_2$) layer) is formed at the interface between the metal layer M and the oxide semiconductor film 7'. The unoxidized portion remains as the metal layer M. At this point, concurrently with the oxidation of the second metallic element, the oxide semiconductor film 7' becomes reduced. As a result, the oxygen deficiency increases in the portion of the oxide semiconductor film 7' that is located under the metal layer M. In this manner, the oxide semiconductor film 7' is made electrically conductive to become the first metal oxide layer m1. Since the oxide semiconductor film 7' is made electrically conductive across the thickness direction as has been described earlier, no semiconductor region remains under the first metal oxide layer m1. In other words, the first metal oxide layer m1 is in contact with the gate dielectric layer 5, such that no semiconductor region exists between these layers. On the other hand, the portion of the oxide semiconductor film 7' that is not in contact with the metal layer M is not reduced through the above reaction, but remains as a semiconductor region.

In the present embodiment, in the region where the oxide semiconductor TFT is formed, the portion of the oxide semiconductor film in which the TFT channel is to be formed remains as a semiconductor region, and becomes the oxide semiconductor layer 7. The portion of the oxide semiconductor film that is in contact with the metal layer M is made electrically conductive to become the first metal oxide layer m1 in the source electrode 13a, the source line 13s, and the drain electrode 13b. Moreover, in the region where a capacitor element is formed, the oxide semiconductor film is made electrically conductive to become the first metal oxide layer m1, thus constituting an upper electrode 13c of the capacitor element. Therefore, no semiconductor region remains between the lower electrode 3c in the gate line layer and the upper electrode 13c.

The layer which is made of the oxide semiconductor film 7' and which includes the oxide semiconductor layer 7 and the first metal oxide layer m1 is designated the oxide layer 6. As can be seen from FIGS. 3(a) to (d), in this example, the oxide layer 6 has the same pattern as the pattern of the metal layer M when viewed from the normal direction of the substrate 1, except for the portion to become the channel of the oxide semiconductor TFT. This allows the first and second metal oxide layers m1 and m2 to be disposed over substantially the entire surface of the source line layer (i.e., substantially the entire lower face of the metal layer M), whereby reflection of visible light by the source line layer can be more effectively suppressed.

Although there is no particular limitation as to the thickness Tm1 of the first metal oxide layer m1, it may be substantially equal to the thickness of the oxide semiconductor film, for example. Moreover, the thickness Tm2 of the second metal oxide layer m2 may be substantially equal to the thickness Tm1 of the first metal oxide layer m1, for example. Therefore, the thickness TM1 of the metal layer M after the second metal oxide layer m2 is formed is smaller than the thickness TM1' of the metal layer M having just been formed on the oxide semiconductor film, by the thickness Tm2 of the second metal oxide layer m2 (TM1≈TM1'≈-Tm2). The ratio Tm1:Tm2:TM1 between the thicknesses of the respective layers is 1:1:1 to 2, for example.

The heat treatment conditions for forming the first and second metal oxide layers m1 and m2 are appropriately set so that the oxide semiconductor film can be made electrically conductive across the thickness direction. For example, the heat treatment temperature may be not less than 250° C.

and not more than 400° C., and the heat treatment time may be set to 1 hour or more. Preferably, the heat treatment temperature is set to not less than 300° C. and not more than 350° C. As a result, the electrical resistivity of the first metal oxide layer m1 can be sufficiently reduced, and good TFT characteristics can be obtained.

Although not explained above, as necessary, a contact hole may be formed in the gate dielectric layer 5 so as to connect the gate line layer and the source line layer, or a contact hole may be formed in the passivation film 15 so as to connect the source line layer and an electrode which is formed in an upper layer.

The production method for the semiconductor device 1001 of the present embodiment is not limited to the above method. In the above method, after the electrode film for sources and the oxide semiconductor film are concurrently patterned, only the electrode film for sources is further patterned to partially expose the oxide semiconductor film. These patterning steps may be conducted through a photolithography process using a gradation mask.

FIG. 5(a) to FIG. 5(f) respectively are step-by-step cross-sectional views for describing a method of forming a source line layer by using a gradation mask. Although the description herein will be directed to a method of forming the source electrode 13a, it is also applicable to other electrodes/lines in the source line layer. It is also applicable to any conductor layer other than the source line layer.

Figure 5:
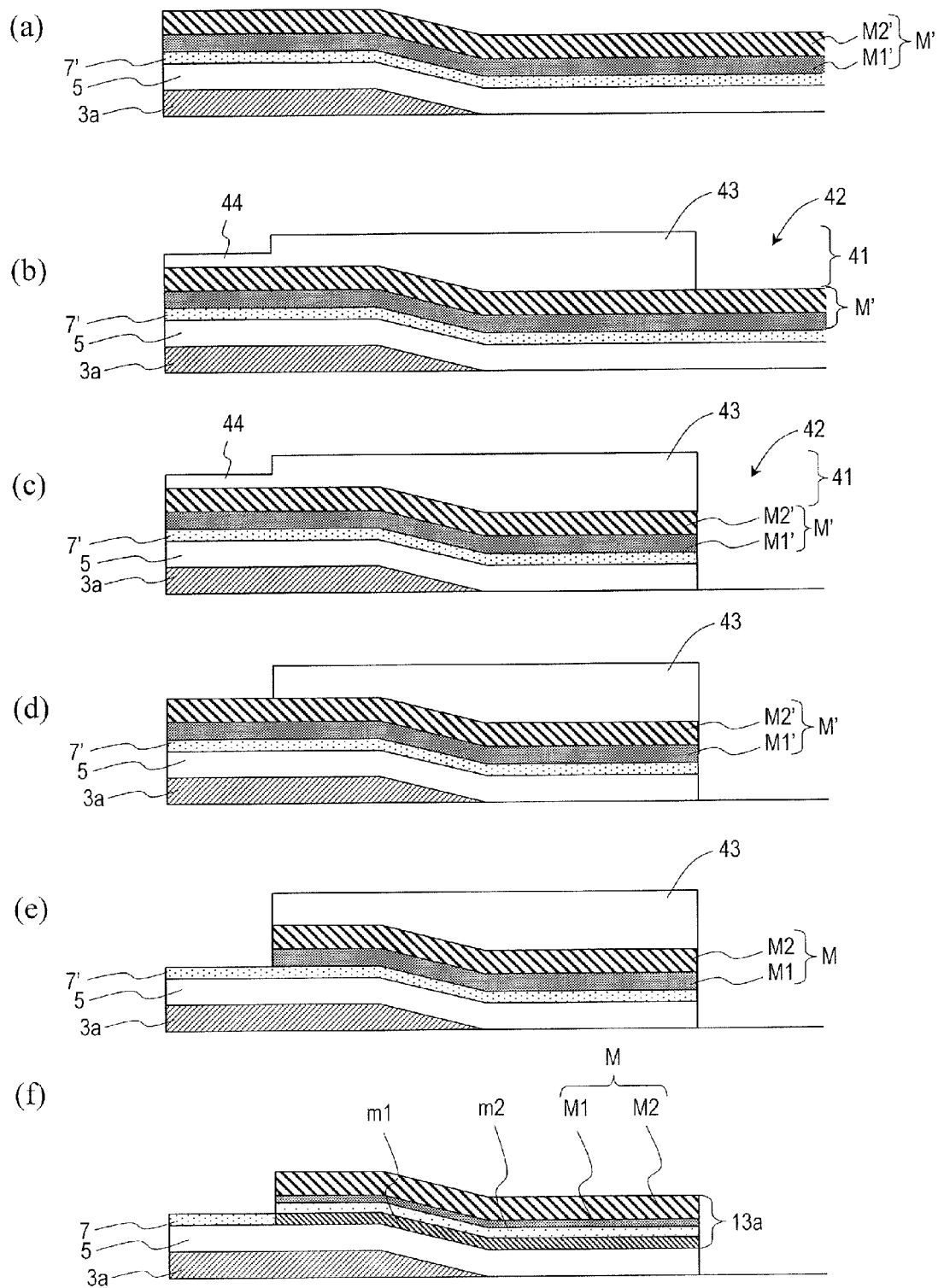
FIG. 5 (a) to (f) respectively are step-by-step cross-sectional views illustrating another exemplary method of forming a source line layer of the semiconductor device 1001.

First, as shown in FIG. 5(a), an oxide semiconductor film 7' is formed on a gate electrode 3a via a gate dielectric layer 5. Thereafter, a metal film M' is formed on the oxide semiconductor film 7'. Herein, the gate electrode 3a is a Ti/Cu film, for example, and the oxide semiconductor film 7' is an In—Ga—Zn—O type semiconductor film, for example. The metal film M' is a multilayer film which includes a first metal film (e.g., a Ti film) M1' and a second metal film (e.g., a Cu film) M2' in this order, for example.

Next, as shown in FIG. 5(b), a photoresist film is formed on the metal film M', which is then subjected to exposure and development by using a gradation mask to form a mask layer 41.

When a photoresist film is exposed to light using a gradation mask, regions which have been subjected to three different amounts of exposure (a minimum value, a maximum value, and an intermediate value therebetween) are formed through a single exposure step. Through development thereof, a mask layer 41 having plural portions of different thicknesses can be formed. The regions under an intermediate amount of exposure are defined by the halftone mask. When the photoresist film is made of a negative type photoresist, the regions under the maximum amount of exposure have the largest thickness; openings are formed in the regions under the minimum amount of exposure; and dents (portions that are thinner than the regions under the maximum amount of exposure) are formed in the regions under an intermediate amount of exposure. When a positive type photoresist is used, the regions under the minimum amount of exposure have the largest film thickness; openings are formed in the regions under the maximum amount of exposure; and dents are formed in the regions under an intermediate amount of exposure.

The mask layer 41 resulting from the development has an opening 42 over a region in which the oxide semiconductor film 7' is to be removed, while having a first portion 43 over a region in which both the oxide semiconductor film 7' and the electrode film for sources are to remain and a second portion (also referred to as a dent) 44, which is thinner than the first portion, over a region where only the oxide semiconductor film 7' is to remain (i.e., the region in which to form a channel).

Then, as shown in FIG. 5(c), with the mask layer 41 as an etching mask, portions of the first metal film M1', the second metal film M2', and the oxide semiconductor film 7' that are located under the opening 42 are removed.

Next, as shown in FIG. 5(d), the mask layer 41 is subjected to ashing to reduce the thickness of the mask layer 41. As a result, the second portion 44 is removed, whereby the second metal film M2' over the region in which a channel is to be formed is exposed.

Thereafter, as shown in FIG. 5(e), by using the mask layer 41 after the ashing treatment as an etching mask, portions of the first metal film M1' and the second metal film M2' that are located over the region in which a channel is to be formed are removed. Thus, a first metal layer M1 and a second metal layer M2 are obtained respectively from the first metal film M1' and the second metal film M2'.

Next, as shown in FIG. 5(f), a passivation layer (not shown) is formed on the second metal layer M2, and thereafter a heat treatment is conducted at a temperature of 300° C. for 2 hours, for example. Thus, the metal (Ti) contained in the first metal layer M1 takes oxygen away from the oxide semiconductor film 7', whereby the portion of the first metal layer M1 that is located on the oxide semiconductor film 7' side is oxidized, whereby a second metal oxide layer m2 (e.g., a titanium oxide layer with a thickness of about 20 nm) is formed. Moreover, the portion of the oxide semiconductor film 7' that is located under the first metal layer M1 becomes reduced so as to have a lower oxygen ratio (i.e., electrically conductive), thus becoming the first metal oxide layer m1. The portion of the oxide semiconductor film 7' that has not become electrically conductive remains as a semiconductor region, thus becoming the oxide semiconductor layer 7.

Second Embodiment

Hereinafter, a second embodiment of the semiconductor device according to the present invention will be described.

Figure 6:
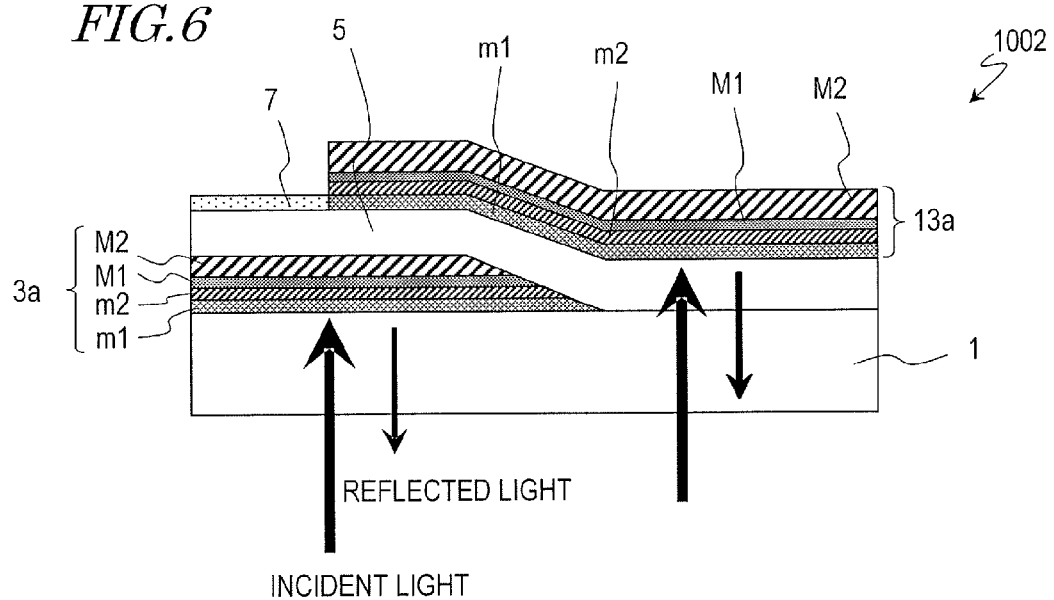
FIG. 6 A cross-sectional view of a semiconductor device 1002 according to a second embodiment of the present invention.

FIG. 6 is a cross-sectional view showing an exemplary semiconductor device 1002 of the present embodiment. The semiconductor device 1002 differs from the semiconductor device 1001 shown in FIG. 2 in that not only the source line layer including source electrodes 13a and source lines but also the gate line layer including gate electrodes 3a and gate lines have a multilayer structure M/m2/m1 of first and second metal oxide layers m1 and m2 and a metal layer M. Otherwise, the construction is similar to that of the semiconductor device 1001, and the description thereof is omitted.

With the semiconductor device 1002, light (visible light) entering the semiconductor device 1002 through the substrate 1 is restrained from being reflected by the gate electrodes 3a and the source electrodes 13a. Therefore, deterioration in the TFT characteristics due to incidence of visible light on the oxide semiconductor layer 7 can be suppressed more effectively.

Note that, other than the gate electrodes and gate lines, a light shielding layer or an antireflection layer for suppressing light reflection may be provided within the gate line layer. Such a light shielding layer and/or an antireflection layer will also have the same multilayer structure as that of the gate electrodes 3a, thus exhibiting high light shielding characteristics or antireflection characteristics.

Third Embodiment

Hereinafter, a third embodiment of the semiconductor device according to the present invention will be described. The present embodiment differs from the semiconductor devices 1001 and 1002 of the foregoing embodiments in that an etchstop (channel protection layer) 9 is provided on the oxide semiconductor layer 7 of the oxide semiconductor TFT 10.

Figure 7:
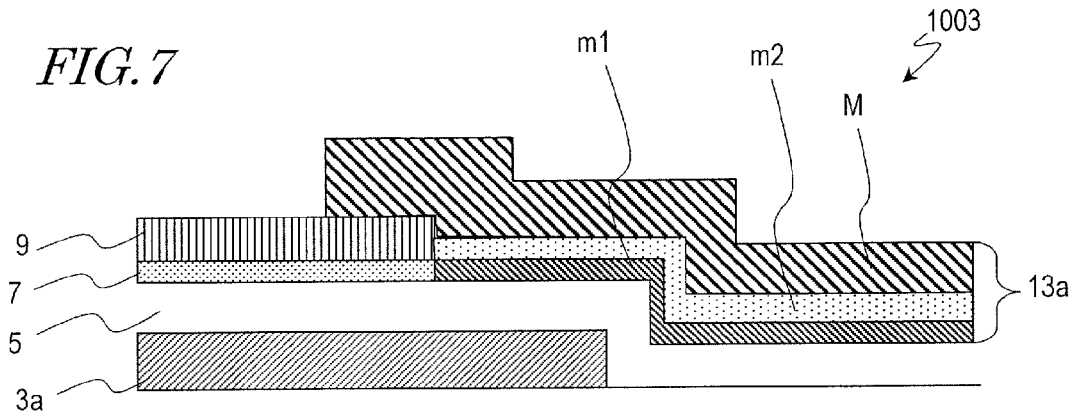
FIG. 7 A cross-sectional view of a semiconductor device 1003 according to a third embodiment of the present invention.
Figure 8:
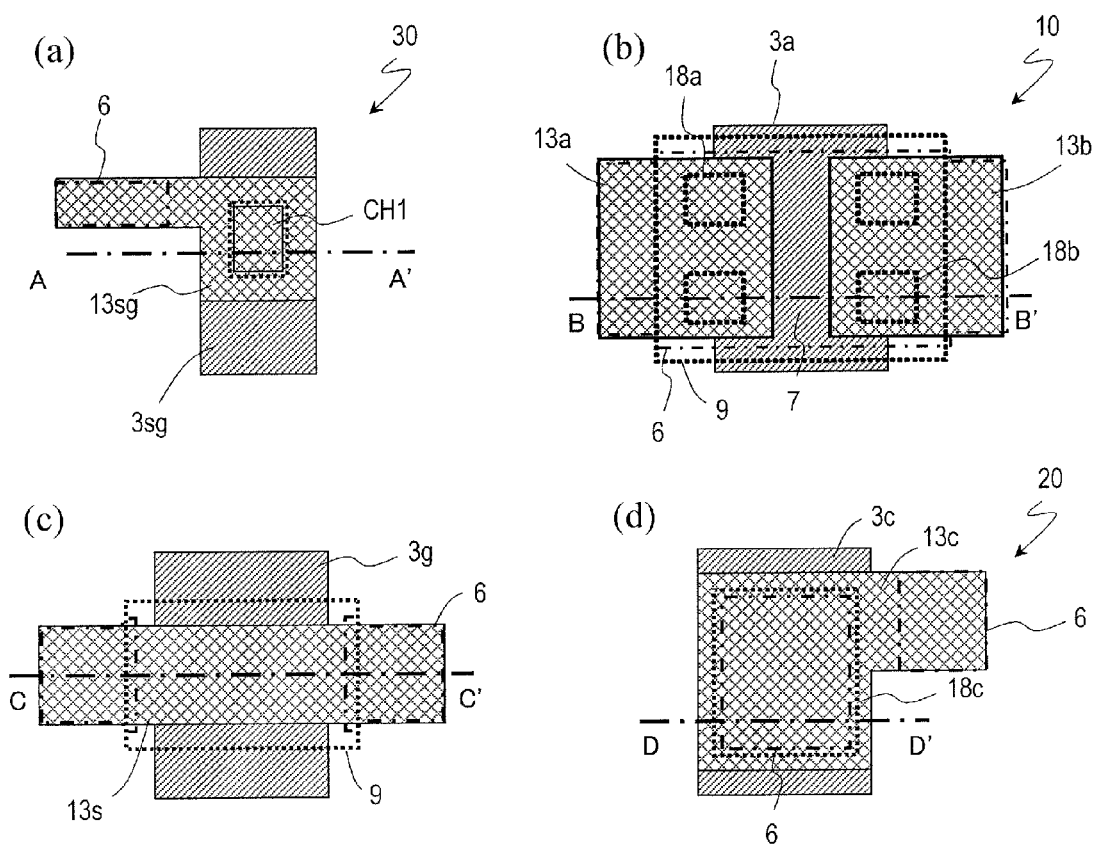
FIG. 8 (*a*) to (*d*) are plan views respectively illustrating an exemplary source-gate connecting portion 30, an exemplary oxide semiconductor TFT 10, an exemplary intersection at which a source line layer and a gate line layer intersect, and an exemplary capacitor element 20 in the semiconductor device 1003.

FIG. 7 is a partial cross-sectional view illustrating an exemplary semiconductor device 1003 of the present embodiment. In FIG. 7, constituent elements similar to those of the semiconductor device show in FIG. 1 are denoted by like reference numerals.

In the semiconductor device 1003, an etchstop 9 is formed on the oxide semiconductor layer 7. The source electrodes 13a are disposed on the gate dielectric layer 5 and the etchstop 9. The portions of the source electrode 13a that are located on the gate dielectric layer 5 have a multilayer structure M/m2/m1 including a first metal oxide layer m1, a second metal oxide layer m2, and a metal layer M. Any portion of the source electrode 13a that is located on the etchstop 9 is composed only of the metal layer M. Thus, in the source line layer according to the present embodiment, the portions that are in contact with the gate dielectric layer 5 have an electrode structure M/m2/m1, while any other portion (the portions which are in contact with the etchstop 9) is composed only of the metal layer M, rather than having metal oxide layers m1 and m2. Although the metal layer M is a single layer in the illustrated example, it may alternatively have a multilayer structure. Otherwise, the construction is similar to the construction which has been described with reference to FIG. 1, and the description thereof is omitted.

In the present embodiment, too, the metal oxide layers m1 and m2 are disposed on the substrate 1 side of the metal layer M of the source line layer, whereby an effect of suppressing reflection by the metal layer M is obtained similarly to the foregoing embodiments. Moreover, by forming an upper electrodes of capacitor elements within the source line layer, it is possible to restrain changes in capacitance associated with changing electrical resistance of the oxide semiconductor. Furthermore, since the portions to become channels are protected by the etchstop 9, reliability of the oxide semiconductor TFT is further improved.

Next, a production method for the semiconductor device 1003 of the present embodiment will be described, with respect to a TFT substrate having oxide semiconductor TFTs as an example.

Figure 9:
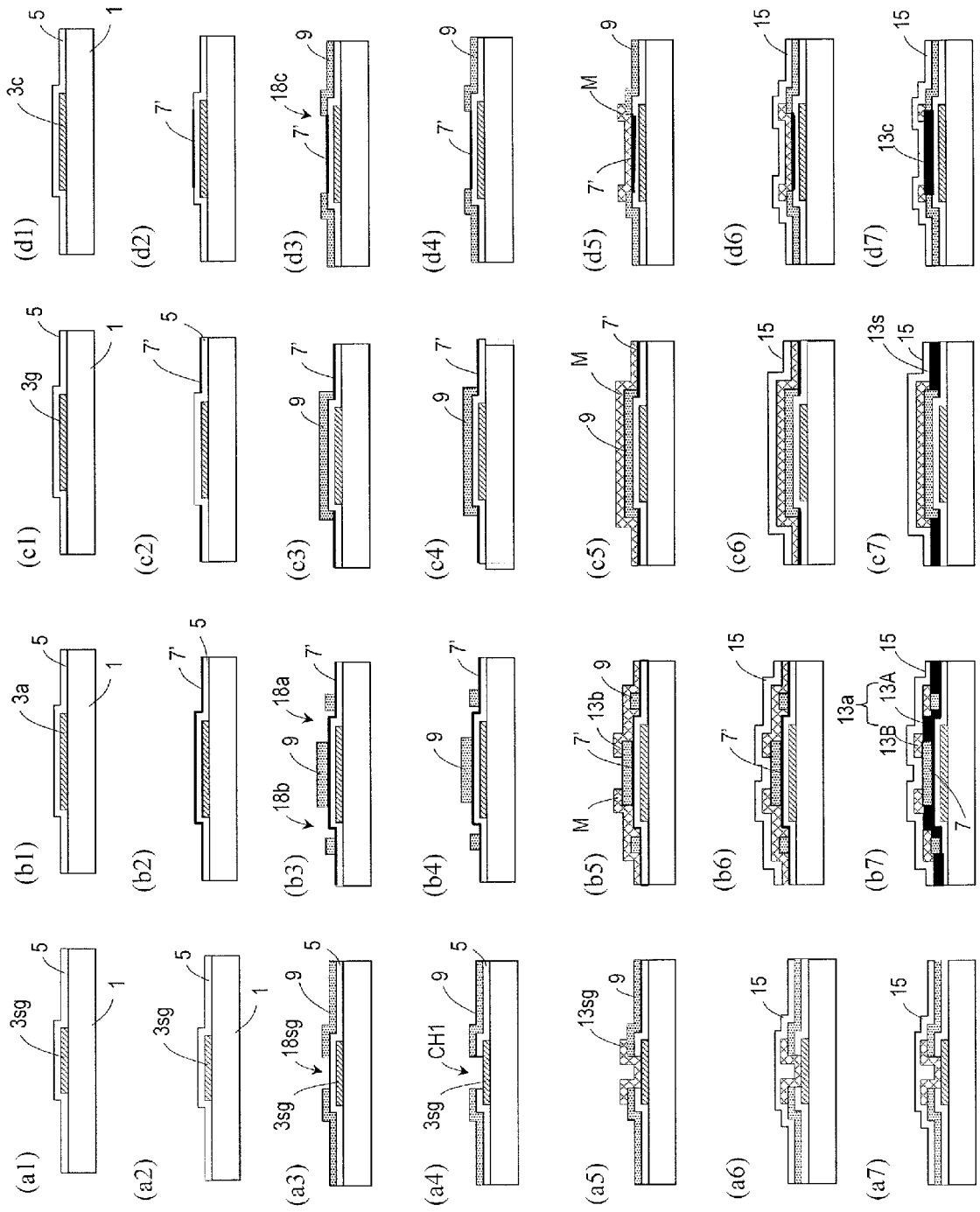
FIG. 9 A schematic diagram for describing a production method of the semiconductor device 1003, where (*a*1) to (*a*7) respectively are step-by-step cross-sectional views of a gate/source formation region forming a source-gate connecting portion 30; (*b*1) to (*b*7) respectively are step-by-step cross-sectional views of a transistor formation region forming an oxide semiconductor TFT 10; (*c*1) to (*c*7) respectively are step-by-step cross-sectional views of an intersection formation region at which a source line layer and a gate line layer intersect; and (*d*1) to (*d*7) respectively are step-by-step cross-sectional views of a capacitance formation region forming a capacitor element 20.

FIGS. 8(a) to (d) are plan views respectively showing a source-gate connecting portion 30, an oxide semiconductor TFT 10, an intersection at which a source line layer and a gate line layer intersect, and a capacitor element 20 in the semiconductor device 1003. FIGS. 9(a1) to (a7) are step-by-step cross-sectional views of a gate/source formation region forming a source-gate connecting portion 30, showing a cross section along line A-A' in FIG. 8(a). FIGS. 9((b1) to (b7) are step-by-step cross-sectional views of a transistor formation region forming an oxide semiconductor TFT 10, showing a cross section along line B-B' in FIG. 8(b). FIGS. 9(c1) to (c7) are step-by-step cross-sectional views of an intersection formation region at which a source line layer and a gate line layer intersect, showing a cross section along line C-C' in FIG. 8(c). FIGS. 9(d1) to (d7) are step-by-step cross-sectional views of a capacitance formation region forming a capacitor element 20, showing a cross section along line D-D' in FIG. 8(d).

First, as shown in FIGS. 9(a1) to (d1), an electrode film for gates is formed on a substrate 1, and thereafter is patterned. Thus, a gate line layer including a gate connecting portion 3sg, a gate electrode 3a, a gate line 3g, and a CS capacitor line 3c is formed. Next, a gate dielectric layer 5 is formed so as to cover the gate line layer. The materials, thicknesses, and formation methods of the respective layers may be similar to the materials, thickness, and formation methods which have been described with reference to FIGS. 3(a1) to (d1).

Then, as shown in FIGS. 9(a2) to (d2), an oxide semiconductor film (e.g., an In—Ga—Zn—O type semiconductor film) 7' is formed on the gate dielectric layer 5 by e.g. a sputtering technique, and patterned. In this example, the portion of the oxide semiconductor film 7' that is located in a source-gate connecting portion formation region and the portion located over an intersection formation region are removed by patterning. At the intersection, at least the portion of the oxide semiconductor film 7' that is located between the source line and the gate line may be removed. In the capacitor element formation region, for example, an island-shaped pattern located between capacitor electrodes is formed from the oxide semiconductor film 7'.

Thereafter, as shown in FIGS. 9(a3) to (d3), a dielectric film for forming an etchstop is formed on the substrate 1, and this dielectric film is patterned to give an etchstop 9. The etchstop 9 may be formed at least in the portion of the oxide semiconductor film 7' to become a channel. The etchstop 9 may be a dielectric layer, or an oxide layer such as an $SiO_2$ layer (thickness: e.g. not less than 100 nm and not more than 400 nm).

In this example, through patterning, an opening 18sg is made in the portion of the dielectric film for forming an etchstop that is located in the source-gate connecting portion region. Moreover, openings 18a and 18b are made in the portions of the dielectric film for forming an etchstop that are located on opposite sides of the portion of the oxide semiconductor film 7' to become a channel. Furthermore, the portion of the dielectric film for forming an etchstop that is located in a region to form a source line is removed. However, the portion located between the source line and the gate line in the intersection may be left without being removed. In the capacitor element formation region, the portion in the region to form an upper electrode of the capacitor element is removed to make an opening 18c.

Thereafter, as shown in FIG. 9(a4), in the source-gate connecting portion region, an opening is made in the gate dielectric layer 5 being exposed through the opening 18sg of the etchstop 9, thus exposing the gate connecting portion 3sg. As a result, a contact hole CH1 is formed in the etchstop 9 and the gate dielectric layer 5.

Then, as shown in FIGS. 9(a5) to (d5), an electrode film for sources is formed on the oxide semiconductor film 7' by a sputtering technique, for example, and the electrode film for sources is patterned. In this manner, a metal layer M composing electrodes/lines having metal oxide layers (source line layer) is obtained. The material, thickness, and formation method of the metal layer M may be similar to the material, thickness, and formation method which have been described with reference to FIGS. 3(a4) to (d4).

In this example, in the source-gate connecting portion region, a source connecting portion 13sg which comes in contact with the gate connecting portion 3sg within the contact hole CH1 is formed from the electrode film for sources. The source connecting portion 13sg is composed of the metal layer M. In the transistor formation region, a metal layer M to become a source electrode and a drain electrode is formed (source-drain separation) from the electrode film for sources. These metal layers M are electrically isolated from each other, and are in contact with the oxide semiconductor film 7' within the corresponding openings 18a and 18b in the etchstop 9. In the intersection formation region, a portion of the metal layer M is disposed on the etchstop 9. In the capacitor element formation region, a metal layer M composing the upper electrode of the capacitor element is formed. This metal layer M is disposed in contact with the oxide semiconductor film 7' within the opening 18c in the etchstop 9.

Note that the patterning of the electrode film for sources is performed in a state where the portion of the oxide semiconductor film 7' to become a channel is covered by the etchstop 9. Therefore, the portion to become the channel is restrained from being damaged during patterning.

Then, as shown in FIGS. 9(a6) to (d6), a passivation film (e.g., an $SiO_2$ film) 15 is formed so as to cover the metal layer M.

Next, a heat treatment is performed under cover of the passivation film 15. As a result, in the portion of the metal layer M that is in contact with the oxide semiconductor film 7', the metal layer M reacts with the oxide semiconductor film 7', whereby a conductor layer having a multilayer structure M/m2/m1 including a first metal oxide layer m1, a second metal oxide layer m2, and a metal layer M is obtained. The lower face of the first metal oxide layer m1 is in contact with the gate dielectric layer 5. On the other hand, in the portion of the metal layer M that is not in contact with the oxide semiconductor film 7' (i.e., the portion located over the etchstop 9), no metal oxide layer is formed under the metal layer M. In this manner, as shown in FIGS. 9(a7) to (d7), a source line layer having a portion 13A in which a metal oxide layer is included and a portion 13B in which no metal oxide layer is included is obtained. The source line layer includes the source connecting portion 13sg (FIG. 9(a7)), the source electrode 13a and drain electrode 13b (FIG. 9(b7)), the source line 13s (FIG. 9(c7)), and the upper electrode 13c (FIG. 9(d7)). In this example, only the gate dielectric layer 5 is located as the dielectric film between the electrodes 3c and 13c. In the intersection, the source line 13s is composed only of the metal layer M, while the gate dielectric layer 5 and the etchstop 9 are disposed between the gate line 3g and the source line 13s (metal layer M).

The layer which is made of the oxide semiconductor film 7' and which includes the oxide semiconductor layer 7 (which is a semiconductor region) and the first metal oxide layer m1 (which is a conductor region) is designated the oxide layer 6. In this example, the oxide semiconductor film 7' and the electrode film for source formation are separately patterned; therefore, as can be seen from FIGS. 8(a) to (d), the pattern of the oxide layer 6 when viewed from the normal direction of the substrate 1 is different from the pattern of the metal layer M.

EXAMPLE AND COMPARATIVE EXAMPLE

The antireflection effects by the first and second metal oxide layers m1 and m2 according to the above embodiments were examined. The method and results thereof will be described.

First, an oxide semiconductor film was formed on a substrate, and a metal layer was then formed on its upper face. In this state (i.e., a state before a heat treatment being conducted), light is allowed to enter through the substrate, and a reflectance measurement was taken. Herein, as reflectance, an intensity (%) of reflected light against the intensity of incident light being defined as 100 was measured.

Next, a heat treatment was performed to allow the oxide semiconductor film and the metal layer to react, thus obtaining a conductor layer having metal oxide layers of the multilayer structure M/m1/m2. Similarly to the above, light was allowed to be incident on this conductor layer through the substrate, and a reflectance measurement was taken.

Figure 10:
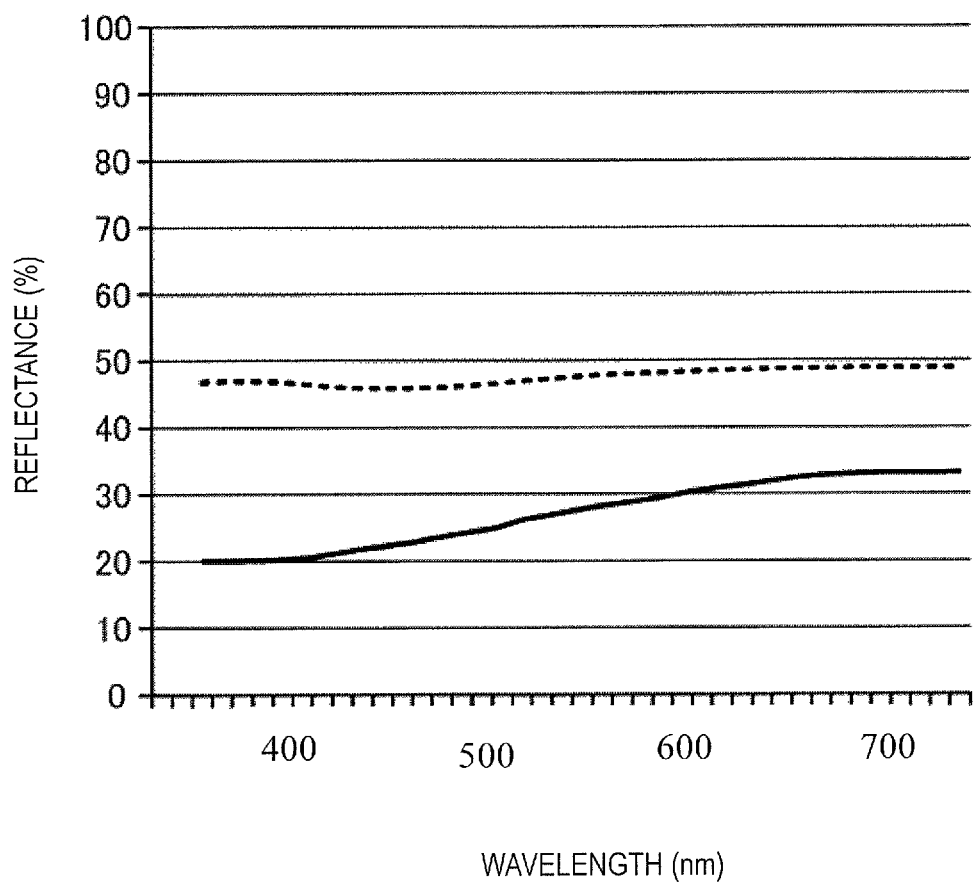
FIG. 10 A diagram for describing an effect of a conductor layer including first and second metal oxide layers according to an embodiment of the present invention.

FIG. 10 is a diagram showing results of reflectance measurement. The broken line represents the reflectance before the heat treatment, whereas the solid line represents the reflectance after the heat treatment. From the results shown in FIG. 10, it can be seen that, by forming the metal oxide layers m1 and m2 under the metal layer through the heat treatment, it becomes possible to suppress reflection of visible light by the metal layer, whereby a conductor layer with low reflectance is obtained.

The aforementioned semiconductor devices 1001 to 1003 can be used as the active matrix substrate of a liquid crystal display device, an organic EL display device, an MEMS display device, or the like, for example. Moreover, electrodes or lines having the electrode structure according to the present embodiments may be provided on the viewer's side of the substrate of a display device. This allows to restrain light entering the display device at the viewer's side from being reflected by the electrodes or lines, thereby providing an improved displaying contrast.

Furthermore, it is advantageous to apply the above embodiments to a semiconductor device having capacitor elements, because changes in capacitance due to the oxide semiconductor layer will be suppressed.

INDUSTRIAL APPLICABILITY

Embodiments of the present invention are broadly applicable to devices having thin film transistors, such as: circuit boards, e.g., active matrix substrates; display devices, e.g., liquid crystal display devices, organic electroluminescence (EL) display devices, and inorganic electroluminescence display devices; imaging devices, e.g., image sensor devices; and electronic devices, e.g., image input devices and fingerprint reading devices.

REFERENCE SIGNS LIST 1 substrate
3a gate electrode
3c CS capacitor line (lower electrode of capacitor element)
3sg gate connecting portion
3g gate line
5 gate dielectric layer
6 oxide layer
7 oxide semiconductor layer (active layer)
9 etchstop
10 oxide semiconductor TFT
13a source electrode
13b drain electrode
13sg source connecting portion
13c capacitor element ⊘ upper electrode
13s source line
15 passivation film
20 capacitor element
30 source-gate connecting portion
1001, 1002, 1003 semiconductor device

The invention claimed is:

1. A semiconductor device comprising a substrate, and an oxide semiconductor layer and a conductor layer supported on the substrate,
the oxide semiconductor layer containing a first metallic element,
the conductor layer having a multilayer structure including
a first metal oxide layer containing the first metallic element,
a second metal oxide layer on the first metal oxide layer, the second metal oxide layer containing an oxide of a second metallic element, and
a metal layer on the second metal oxide layer, the metal layer containing the second metallic element, wherein,
the first metal oxide layer and the oxide semiconductor layer are made of a same oxide film;
when viewed from a normal direction of the substrate, the first metal oxide layer and the oxide semiconductor layer do not overlap each other;
the same oxide film is an oxide semiconductor film containing the first metallic element:
the first metal oxide layer is a layer having been made electrically conductive as a result of the oxide semiconductor film reacting with the metal layer; and
the second metal oxide layer is a layer resulting from a portion of the metal layer reacting with the oxide semiconductor film.

2. The semiconductor device of claim 1, wherein an atomic ratio of oxygen relative to the totality of metallic elements contained in the first metal oxide layer is 95% or less of an atomic ratio of oxygen relative to the totality of metallic elements that is calculated from a stoichiometric composition of the oxide semiconductor film.

3. The semiconductor device of claim 1, wherein the first metal oxide layer has an electrical resistivity of 0.01Ω·cm or less.

4. The semiconductor device of claim 1, further comprising a thin film transistor, wherein
the conductor layer includes a source electrode of the thin film transistor, and a source line connected to the source electrode.

5. The semiconductor device of claim 4, wherein the oxide semiconductor layer functions as an active layer of the thin film transistor.

6. The semiconductor device of claim 1, further comprising a capacitor element, wherein,
the capacitor element includes a lower electrode and an upper electrode disposed so as to overlap the lower electrode via a dielectric film; and
the conductor layer includes the upper electrode.

7. The semiconductor device of claim 1, further comprising a thin film transistor, wherein
the conductor layer includes a gate electrode of the thin film transistor and a gate line connected to the gate electrode.

8. The semiconductor device of claim 1, further comprising a thin film transistor, wherein,
the thin film transistor includes an etchstop formed on an upper face of the oxide semiconductor layer;
a portion of a source electrode of the thin film transistor is on the etchstop; and
a portion of the source electrode that is not on the etchstop has the multilayer structure, and the portion of the source electrode that is on the etchstop is composed only of the metal layer.

9. The semiconductor device of claim 1, wherein the first metal oxide layer has a thickness which is substantially equal to a thickness of the oxide semiconductor layer.

10. The semiconductor device of claim 1, wherein the conductor layer includes a light shielding layer to shade the oxide semiconductor layer.

11. The semiconductor device of claim 1, wherein a total thickness of the second metal oxide layer and the metal layer is twice or more of a thickness of the first metal oxide layer.

12. The semiconductor device of claim 1, wherein the first metallic element is indium, and the second metallic element is titanium.

13. The semiconductor device of claim 1, wherein the oxide semiconductor layer and the first metal oxide layer contain an In—Ga—Zn—O type oxide.

14. The semiconductor device of claim 1, wherein the first and second metal oxide layers are layers formed by subjecting the oxide semiconductor film and the metal layer formed thereon to a heat treatment at a temperature of not less than 250° C. and not more than 400° C.

15. A method of producing the semiconductor device of claim 1, comprising:
(a) a step of forming the oxide semiconductor layer on the substrate;
(b) a step of forming the metal layer on a portion of the surface of the oxide semiconductor layer; and
(c) a step of conducting a heat treatment for allowing the metal layer and the oxide semiconductor layer to react to form the first metal oxide layer containing the first metallic element by making a portion of the oxide semiconductor layer that is in contact with the metal layer electrically conductive across a thickness direction, and to form the second metal oxide layer containing the oxide of the second metallic element between the first metal oxide layer and the metal layer; wherein
the step (c) produces the conductor layer having the multilayer structure including the first metal oxide layer, the second metal oxide layer, and the metal layer, and leaving a portion of the oxide semiconductor layer that is not in contact with the metal layer as a semiconductor region to become the oxide semiconductor layer.

16. The method of producing the semiconductor device of claim 15, wherein
the semiconductor device includes a thin film transistor, the method further comprising, before step (a), a step (d) of providing a substrate including a gate electrode of the thin film transistor and a gate dielectric layer formed so as to cover the gate electrode, wherein,
step (a) forms the oxide semiconductor film on the gate dielectric layer; and
the conductor layer includes a source electrode of the thin film transistor and a source line, and the oxide semiconductor layer includes an active layer of the thin film transistor.

17. The method of producing the semiconductor device of claim 16, wherein,
the semiconductor device includes a capacitor element;
step (d) comprises step (d1) of forming an electrically conductive film on the substrate and patterning the electrically conductive film to form the gate electrode and a lower electrode of the capacitor element, and step (d2) of forming the gate dielectric layer so as to cover the gate electrode and the lower electrode; and
the conductor layer includes an upper electrode of the capacitor element, the upper electrode overlapping the lower electrode via the gate dielectric layer.

18. The method of producing the semiconductor device of claim 15, wherein,
step (b) comprises:
forming a metal film on the oxide semiconductor film;
forming a resist layer on the metal film by using a gradation mask, the resist layer having a first portion and a second portion thinner than the first portion;
patterning the metal film by using the resist layer as a mask;
removing the second portion by reducing the thickness of the resist layer; and
a step of patterning the metal film by using the resist layer with the reduced thickness as a mask to expose the portion of the surface of the oxide semiconductor film.

19. The method of producing the semiconductor device of claim 15, wherein the oxide semiconductor film contains an In—Ga—Zn—O type oxide.

* * * * *